United States Patent
Maeda

(10) Patent No.: US 8,810,772 B2
(45) Date of Patent: Aug. 19, 2014

(54) POSITION DETECTOR, POSITION DETECTION METHOD, EXPOSURE APPARATUS, AND METHOD OF MANUFACTURING DEVICE TO ALIGN WAFER BY ADJUSTING OPTICAL MEMBER

(75) Inventor: Hironori Maeda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 1282 days.

(21) Appl. No.: 12/261,145

(22) Filed: Oct. 30, 2008

(65) Prior Publication Data
US 2009/0115985 A1 May 7, 2009

(30) Foreign Application Priority Data
Nov. 2, 2007 (JP) ................................ 2007-286686

(51) Int. Cl.
*G03B 27/68* (2006.01)
(52) U.S. Cl.
USPC ........................................................... 355/52
(58) Field of Classification Search
CPC .............................. G03F 9/7092; G03F 9/7088
USPC ................................................ 355/52, 55, 53
See application file for complete search history.

(56) References Cited

U.S. PATENT DOCUMENTS 6,975,399 B2 * 12/2005 Fukui ............................ 356/401

FOREIGN PATENT DOCUMENTS

JP 11-054418 A 2/1999
JP 2006-278715 A 10/2006

OTHER PUBLICATIONS

JP 11-05441 8 Koga translation. Feb. 1999.*

* cited by examiner

*Primary Examiner* — Chia-how Michael Liu
(74) *Attorney, Agent, or Firm* — Canon USA, Inc. IP Division

(57) ABSTRACT

A position detector (16), configured to detect a position of a mark on an object to be detected, comprises an image pickup unit (34), an optical system, a noise obtaining unit (36) and a correction unit (38). The image pickup unit picks up an image of the object to be detected. The optical system forms an image of the object to be detected on an image pickup surface of the image pickup unit. The noise obtaining unit obtains noise information by picking up an image of a region other than the mark using the optical system and the image pickup unit in accordance with the result of adjustment of an optical member included in the optical system. The correction unit corrects, using the noise information obtained by the noise obtaining unit, the image of the mark obtained using the optical system and the image pickup unit.

12 Claims, 17 Drawing Sheets

F I G. 1
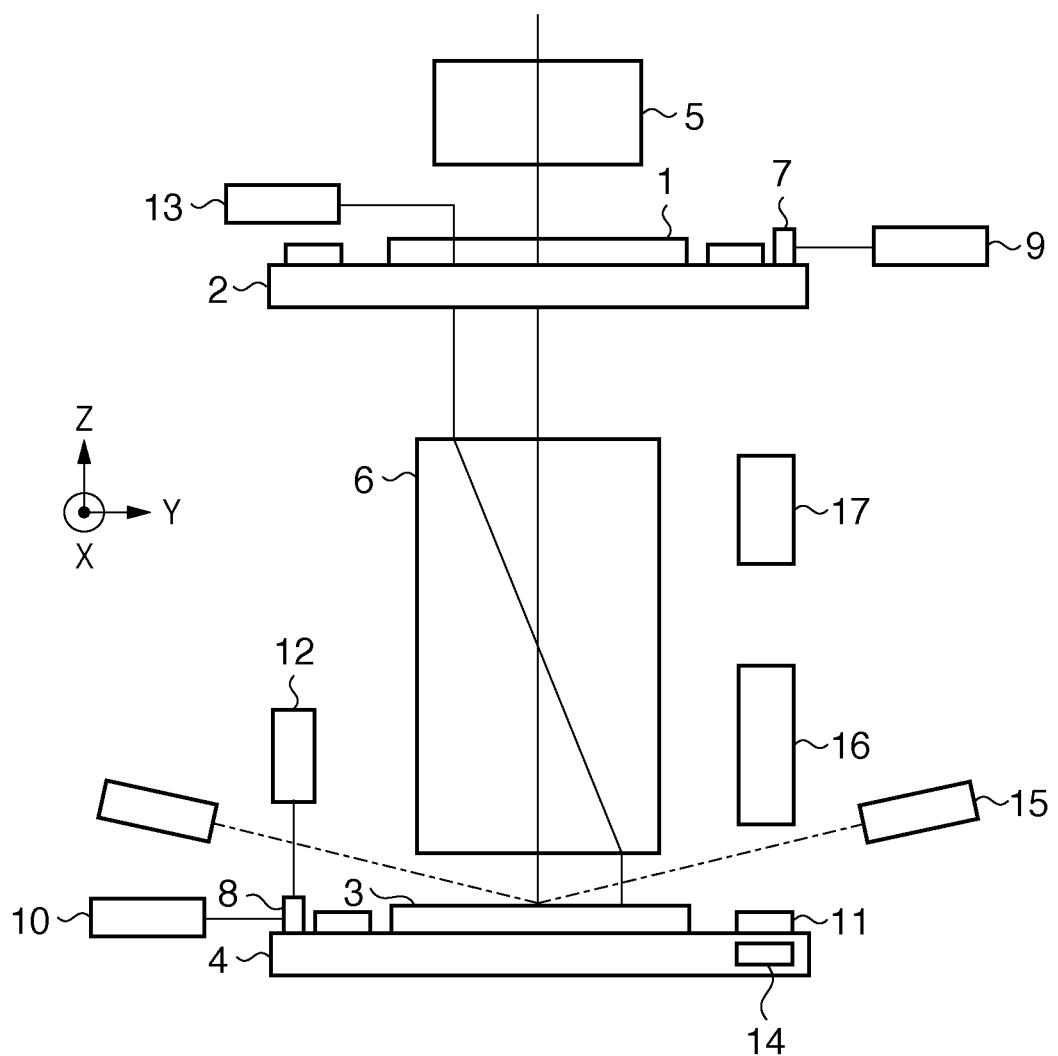

FIG. 6

| ALIGNMENT CONDITION | NOISE SIGNAL |
|---|---|
| CONDITION A | SIGNAL A |
| CONDITION B | SIGNAL B |

F I G. 10
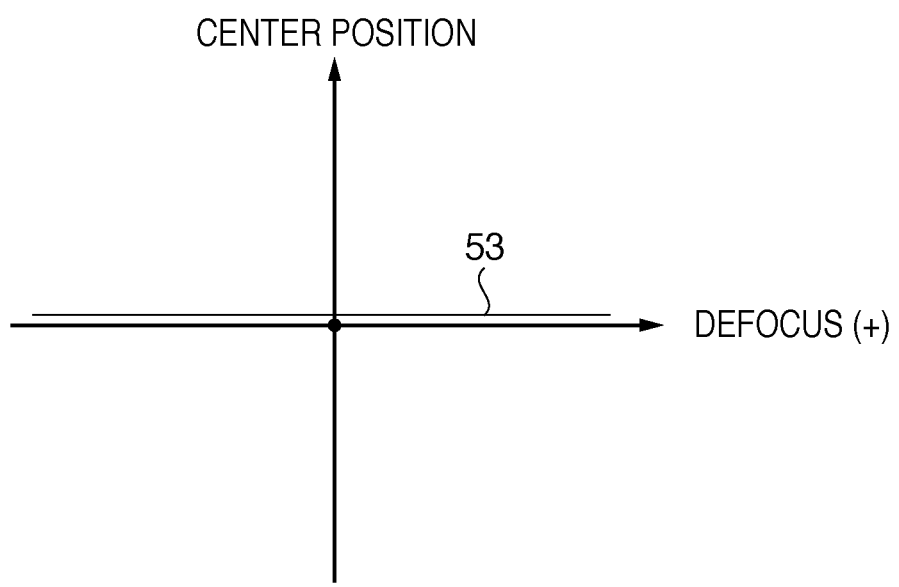

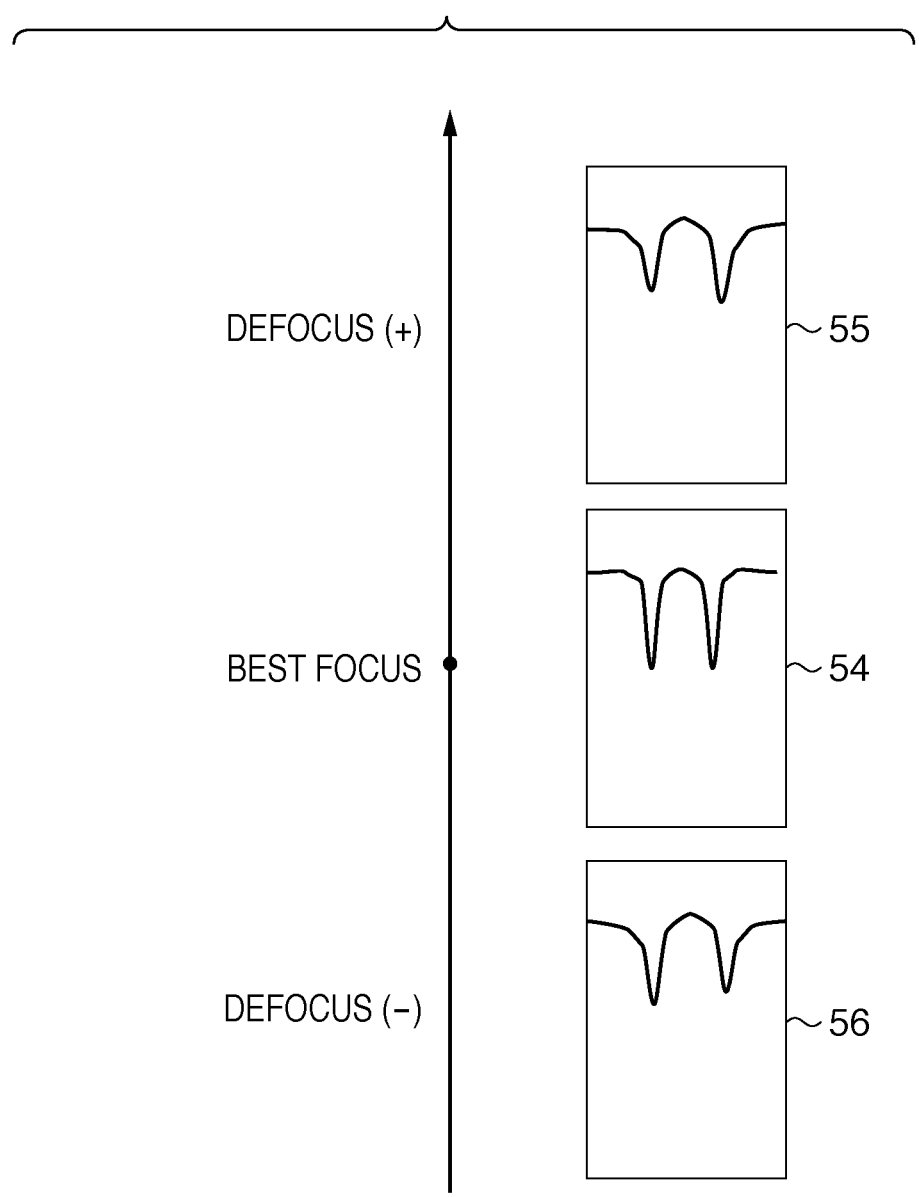
F I G. 11

F I G. 12
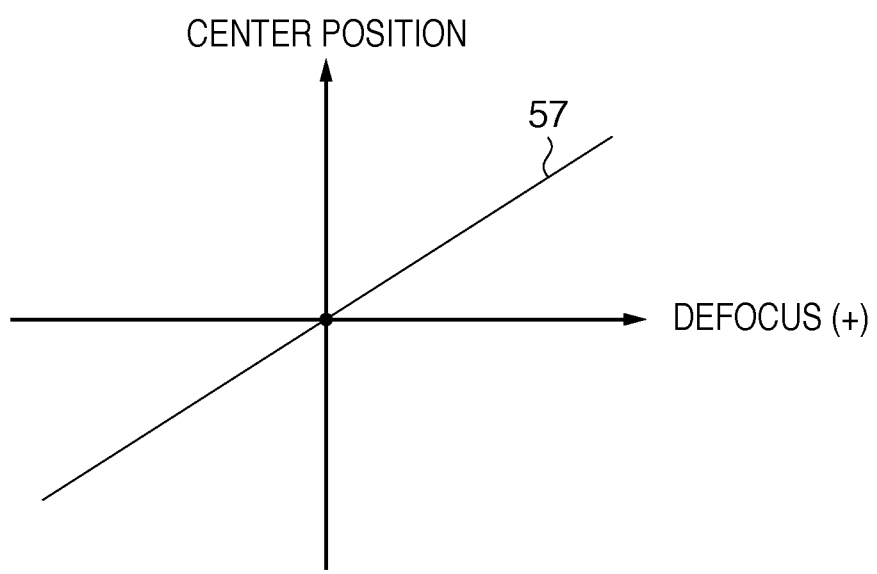

F I G. 14

| ALIGNMENT CONDITION | NOISE SIGNAL |
|---|---|
| CONDITION C | SIGNAL C |

F I G. 16

| ALIGNMENT CONDITION | NOISE SIGNAL |
|---|---|
| CONDITION C | SIGNAL CC |

POSITION DETECTOR, POSITION DETECTION METHOD, EXPOSURE APPARATUS, AND METHOD OF MANUFACTURING DEVICE TO ALIGN WAFER BY ADJUSTING OPTICAL MEMBER

BACKGROUND OF THE INVENTION

1. Field of the Invention

The present invention relates to a position detector, a position detection method, an exposure apparatus, and a method of manufacturing a device.

2. Description of the Related Art

A projection exposure apparatus which projects and transfers a pattern drawn on a reticle or photomask onto, for example, a wafer by a projection optical system has conventionally been employed to manufacture, for example, a semiconductor device, liquid crystal display device, or thin-film magnetic head by using photolithography. A projected image of the mask pattern formed via the projection optical system is aligned with a pattern, which has already been formed on the wafer, by an alignment detection system mounted in the projection exposure apparatus, and then exposure is performed.

Along with advance in micropatterning and an increase in packing density of integrated circuits, the projection exposure apparatus is required to project and transfer a mask pattern onto a wafer by exposure with a higher resolution. A minimum line width (resolution) that the projection exposure apparatus can transfer is proportional to the wavelength of light for use in exposure, and is inversely proportional to the numerical aperture (NA) of the projection optical system. According to this principle, the shorter the wavelength, the better the resolution. In view of this, the light source is currently shifting from the g-line (wavelength: about 436 nm) and the i-line (wavelength: about 365 nm) of a superhigh pressure mercury lamp to a KrF excimer laser (wavelength: about 248 nm) and an ArF excimer laser (wavelength: about 193 nm). The practical application of an $F_2$ laser (wavelength: about 157 nm) to the light source is also in progress. Even EUV (Extreme Ultra-Violet) light having a wavelength of several to 100 nm is expected to be adopted in the future.

To further improve the resolution of the exposure apparatus, an immersion exposure apparatus has been put on the market, which increases the NA by filling at least part of the space between the projection optical system and the wafer with a liquid having a refractive index higher than 1. In the immersion exposure apparatus, the space between the wafer and an optical element which constitutes the end face of the projection optical system on its wafer side is filled with a liquid having a refractive index close to that of the photoresist layer. This makes it possible to increase the effective numerical aperture of the projection optical system seen from its wafer side, thus improving the resolution.

In this manner, along with the shortening of the wavelength of the exposure light, and the advent of the immersion method, the resolution is increasingly improving. To keep up with this trend, a higher overlay accuracy of the wafer is also required. In general, an overlay accuracy of about ⅕ the resolution is necessary. Hence, an improvement in overlay accuracy is increasingly becoming important for advance in micropatterning of semiconductor devices.

Roughly stated, two types of wafer alignment detection systems have been proposed and are in use already. The first system is a so-called off-axis alignment detection system (to be referred to as an OA detection system hereinafter) which is configured separately from the projection optical system and optically detects an alignment mark on the wafer. The second system is an alignment detection system which detects an alignment mark on the wafer using the alignment wavelength of non-exposure light through a projection optical system of the so-called TTL-AA (Through The Lens Auto Alignment) scheme used especially as the alignment scheme of an i-line exposure apparatus.

In the above-described alignment detection systems, the measurement result often has errors resulting from noise components of a detection signal, which is obtained by illuminating and observing the observation target surface, such as the distortion of the detection system due to, for example, an illumination variation, a variation in sensitivity of, for example, the light-receiving element or image pickup element, or dust adhesion on the detection system itself. Considering the current trend toward a higher resolution, it is important to reduce these measurement errors. To reduce these measurement errors, a process of removing these noise components from the detection signal (to be referred to as "noise correction" hereinafter) is performed. The noise correction is a process of measuring in advance various types of noise components of a detection signal obtained by illuminating and observing the observation target surface, storing them as noise signals, and correcting the detection signal of the alignment mark by referring to the noise signals.

The noise signals for noise correction are stored for each normal alignment condition (illumination wavelength, illumination NA, and detection NA), and the noise correction is performed using a noise signal corresponding to each alignment condition. Japanese Patent Laid-Open No. 11-54418 discloses details of such a prior art.

Conditions with regard to the alignment performance of the wafer alignment detection system mounted in the exposure apparatus often change due to a temporal change in the properties of an optical system in the detection system, so they are adjusted as needed. The conditions with regard to the alignment performance include, for example, the aberration, a shift of the optical axis, and a shift component for each wavelength (to be referred to as a "wavelength shift difference" hereinafter), which is generated due to decentration of, for example, a lens or plane-parallel plate. Assume that noise signals used before the adjustment have become no longer optimum although the alignment conditions remain the same. In this situation, as alignment is performed using the previous noise signals, measurement errors are likely to occur.

SUMMARY OF THE INVENTION

It is an object of the present invention to provide a position detector and position detection method which allow high-precision detection even when conditions with regard to position measurement change upon adjustment of an optical member.

According to the first aspect of the present invention, there is provided a position detector which detects a position of a mark on an object to be detected, the detector comprising an image pickup unit configured to pick up an image of the object to be detected; an optical system configured to form an image of the object to be detected on an image pickup surface of the image pickup unit; a noise obtaining unit configured to obtain noise information by picking up an image of a region other than the mark using the optical system and the image pickup unit in accordance with the result of adjustment of an optical member included in the optical system; and a correction unit configured to correct, using the noise information obtained by the noise obtaining unit, the image of the mark obtained using the optical system and the image pickup unit.

According to the second aspect of the present invention, there is provided a position detection method of forming an image of a mark on an object to be detected, and picking up the formed image of the mark by an image pickup unit, thereby detecting a position of the mark, the method comprising a noise obtaining step of obtaining noise information by picking up an image of a region other than the mark using the optical system and the image pickup unit in accordance with the result of adjustment of an optical member included in the optical system; and a correcting step of correcting, using the noise information obtained in the noise obtaining step, the image of the mark obtained using the optical system and the image pickup unit.

According to the present invention, it is possible to provide a position detector and position detection method which allow high-precision detection even when conditions with regard to position measurement change upon adjustment of an optical member.

Further features of the present invention will become apparent from the following description of exemplary embodiments with reference to the attached drawings.

BRIEF DESCRIPTION OF THE DRAWINGS

FIG. 1 is a view schematically showing the arrangement of an exposure apparatus;

FIG. 6 is a table illustrating noise signals corresponding to alignment conditions;

FIG. 10 is a graph showing the center position of the detection signal shown in FIG. 9 with respect to the defocus;

FIG. 11 is a graph obtained by defocusing a detection signal detected in an optical system having a shift of the optical axis;

FIG. 12 is a graph showing the center position of the detection signal shown in FIG. 11 with respect to the defocus;

FIG. 14 is a table illustrating a noise signal corresponding to an alignment condition;

FIG. 16 is a table illustrating a noise signal corresponding to an alignment condition.

DESCRIPTION OF THE EMBODIMENT

Figure 2:
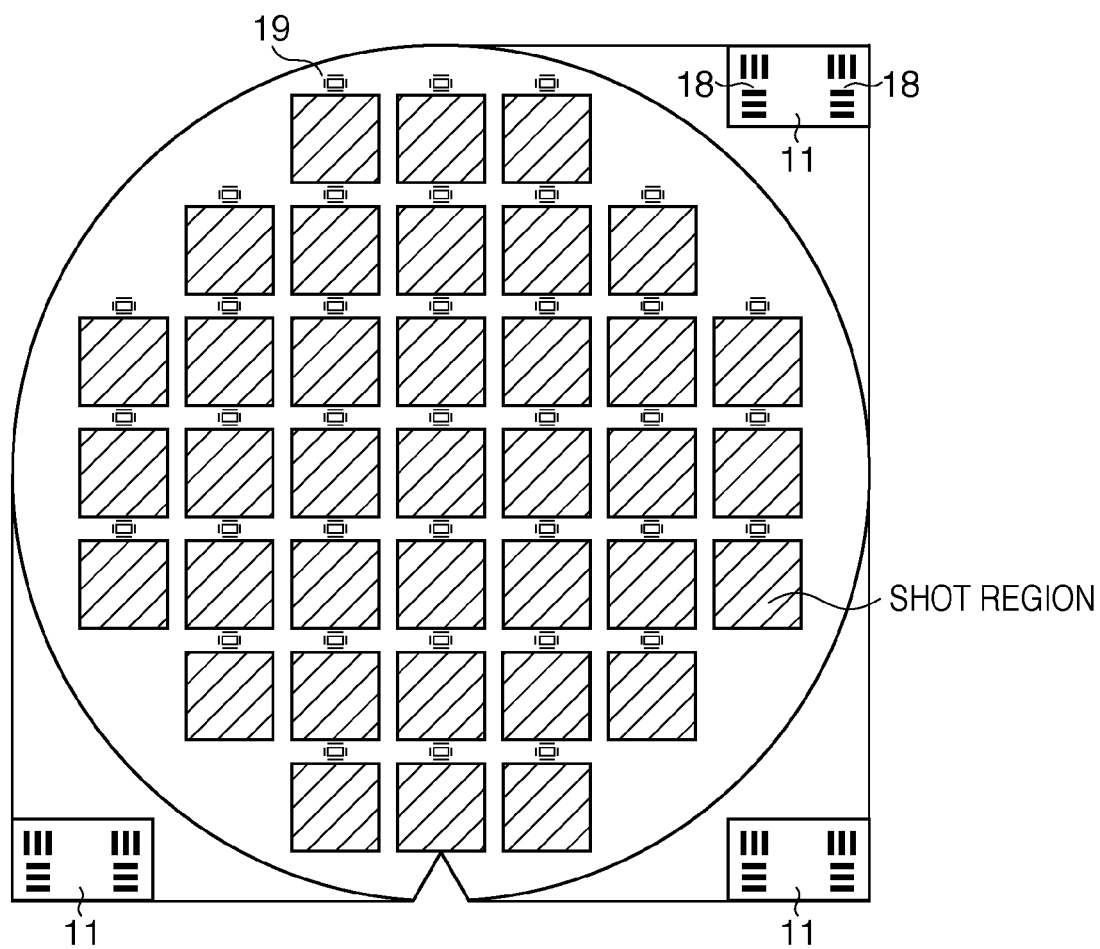
FIG. 2 is a view showing a wafer and stage reference plate.

[Embodiment of Alignment Detector Used for Exposure Apparatus]

A position detector according to the present invention detects the position of a mark formed on an object to be detected in a semiconductor exposure apparatus or liquid crystal exposure apparatus. The object to be detected need only be at least one of a reticle serving as the original, and a wafer serving as the substrate. An exposure apparatus aligns at least one of the original and the substrate on the basis of the position detection result obtained by the position detector. A wafer alignment system which detects the position of a mark formed on a wafer in an exposure apparatus will be exemplified in the following embodiment.

An alignment method when conditions with regard to the alignment performance are changed will be described below with reference to the accompanying drawings.

In an exposure apparatus shown in FIG. 1, a reticle stage 2 supports a reticle 1, and a wafer stage 4 supports a wafer 3. An illumination optical system 5 illuminates the reticle 1 supported by the reticle stage 2 with exposure light. A projection optical system 6 projects and transfers by exposure the reticle pattern image of the reticle 1 illuminated with the exposure light onto the wafer 3 supported by the wafer stage 4. A controller 17 systematically controls the overall operation of the exposure apparatus.

The exposure apparatus in this embodiment is a scanning exposure apparatus (scanner) which transfers a reticle pattern formed on the reticle 1 onto the wafer 3 by exposure while synchronously moving them in the scanning direction. However, it is also possible to use an exposure apparatus (stepper) which transfers a reticle pattern onto the wafer 3 by exposure while the reticle 1 is kept stationary.

The following description will be given assuming that a direction which matches the optical axis of the projection optical system 6 is the Z-axis direction, the direction in which the reticle 1 and wafer 3 are synchronously moved (scanning direction) on a plane7 perpendicular to the Z-axis direction is the Y-axis direction, and a direction (non-scanning direction) perpendicular to the Z- and Y-axis directions is the X-axis direction. Also, the rotation directions about the X-, Y-, and Z-axes are assumed to be the $\theta X$, $\theta Y$, and $\theta Z$ directions, respectively.

A predetermined illumination region on the reticle 1 is illuminated with exposure light having a uniform illuminance distribution by the illumination optical system 5. The exposure light emitted by the illumination optical system 5 can be KrF excimer laser light, ArF excimer laser light or $F_2$ laser light having a shorter wavelength than it, or EUV (Extreme Ultra-Violet) light having a wavelength of several to 100 nm.

The reticle stage 2 can two-dimensionally move on a plane perpendicular to the optical axis of the projection optical system 6, that is, on the X-Y plane, and finely rotate in the $\theta Z$ direction. The reticle stage 2 need only be driven about at least one axis, and may be driven about six axes. The reticle stage 2 is driven by a reticle stage driving mechanism (not shown) such as a linear motor, which is controlled by the controller 17. A mirror 7 is set on the reticle stage 2. A laser interferometer 9 is set at a position opposing the mirror 7. The laser interferometer 9 measures the two-dimensional position and rotation angle of the reticle 1 on the reticle stage 2 in real time, and outputs the measurement result to the controller 17. The controller 17 drives the reticle stage driving mechanism on the basis of the measurement result obtained by the laser interferometer 9, thereby aligning the reticle 1 supported by the reticle stage 2.

The projection optical system 6 projects and transfers by exposure the pattern of the reticle 1 onto the wafer 3 at a predetermined projection magnification $\beta$, and includes a plurality of optical elements. The projection optical system 6 in this embodiment is a reduction projection system having a projection magnification $\beta$ of, for example, ¼ or ⅕.

The wafer stage 4 includes a Z stage for holding the wafer 3 through a wafer chuck, an X-Y stage for supporting the Z stage, and a base for supporting the X-Y stage. The wafer stage 4 is driven by a wafer stage driving mechanism (not shown) such as a linear motor. The wafer stage mechanism is controlled by the controller 17.

A mirror 8 which moves together with the wafer stage 4 is set on the wafer stage 4. An X-Y laser interferometer 10 and Z laser interferometer 12 are set at positions opposing the mirror 8. The laser interferometer 10 measures the rotation angle θZ and the position of the wafer stage 4 in the X and Y directions in real time, and outputs the measurement result to the controller 17. The laser interferometer 12 measures the rotation angles θX and θY and the position of the wafer stage 4 in the Z direction in real time, and outputs the measurement result to the controller 17. By driving the X-Y and Z stages through the wafer stage mechanism on the basis of the measurement results obtained by these laser interferometers 10 and 12, the position of the wafer 3 in the X, Y, and Z directions is adjusted to align the wafer 3 supported by the wafer stage 4.

A reticle alignment detection system 13 is set near the reticle stage 2. The reticle alignment detection system 13 detects reticle alignment detection system reference marks 18 shown in FIG. 2, which is formed on a stage reference plate 11 on the wafer stage 4, through the projection optical system 6 and reticle reference marks (not shown) on the reticle 1. The reticle alignment detection system 13 irradiates the reticle reference marks and reticle alignment detection system reference marks 18 through the projection optical system 6 using a light source which also serves as that which actually exposes the wafer 3, and mounts a photoelectric conversion element for detecting the light reflected by these marks. An example of the photoelectric conversion device mounted in the reticle alignment detection system 13 is a CCD camera. The reticle 1 and wafer 3 are aligned based on the signal output from the photoelectric conversion element. Position and focus alignment between the reticle reference marks (not shown) on the reticle 1 and the reticle alignment detection system reference marks 18 on the stage reference plate 11 makes it possible to align the relative positional relationship (in the X, Y, and Z directions) between the reticle 1 and the wafer 3.

The reference marks 18 detected by the reticle alignment detection system 13 may be transparent marks. The use of a transparent reticle alignment detection system 14, in turn, allows the use of the transparent reticle alignment detection system reference marks 18.

The transparent reticle alignment detection system 14 mounts, for example, a light amount sensor for detecting light which is emitted by a light source which also serves as that which exposes the wafer 3, and is transmitted through the reticle reference marks (not shown), projection optical system 6, and reticle alignment detection system reference marks 18. The transparent reticle alignment detection system 14 measures the amount of transmitted light while driving the wafer stage 4 in the X direction (or Y direction) and Z direction, thereby performing position and focus alignment between the reticle reference marks (not shown) on the reticle 1 and the reticle alignment detection system reference marks 18.

In this manner, the use of either the reticle alignment detection system 13 or the transparent reticle alignment detection system 14 makes it possible to align the relative positional relationship (in the X, Y, and Z directions) between the reticle 1 and the wafer 3.

The stage reference plate 11 at one corner of the wafer stage 4 is set nearly flush with the surface of the wafer 3. The stage reference plate 11 includes wafer alignment detection system reference marks 18 detected by a wafer alignment detection system 16, and reticle alignment detection system reference marks 18 detected by the reticle alignment detection systems 13 and 14. Stage reference plates 11 may be positioned at a plurality of corners of the wafer stage 4. Also, one stage reference plate 11 may include a plurality of reticle alignment detection system reference marks 18 and a plurality of wafer alignment detection system reference marks 18. Note that the positional relationship (in the X and Y directions) between the reticle alignment detection system reference marks 18 and the wafer alignment detection system reference marks 18 is known. The wafer alignment detection system reference marks 18 and reticle alignment detection system reference marks 18 may be common marks.

A focus detection system 15 includes a light-projecting system for projecting detection light onto the surface of the wafer 3, and a light-receiving system for receiving the light reflected by the wafer 3. The detection result obtained by the focus detection system 15 is output to the controller 17. The controller 17 drives the Z stage on the basis of the detection result obtained by the focus detection system 15 to be able to adjust the tilt angle and the position (focus position), in the Z-axis direction, of the wafer 3 held by the Z stage.

The wafer alignment detection system 16 includes a light-projecting system for projecting detection light onto wafer alignment marks 19 on the wafer 3 or the reticle alignment detection system reference marks 18 on the stage reference plate 11, and a light-receiving system for receiving the light reflected by the marks. The detection result obtained by the wafer alignment detection system 16 is output to the controller 17. The controller 17 drives the wafer stage 4 in the X and Y directions on the basis of the detection result obtained by the wafer alignment detection system 16 to be able to adjust the position, in the X and Y directions, of the wafer 3 held by the wafer stage 4.

The wafer alignment detection system 16 in this embodiment is an off-axis alignment detection system (OA detection system). However, the wafer alignment detection system 16 in the present invention is not particularly limited to an OA detection system.

Figure 3:
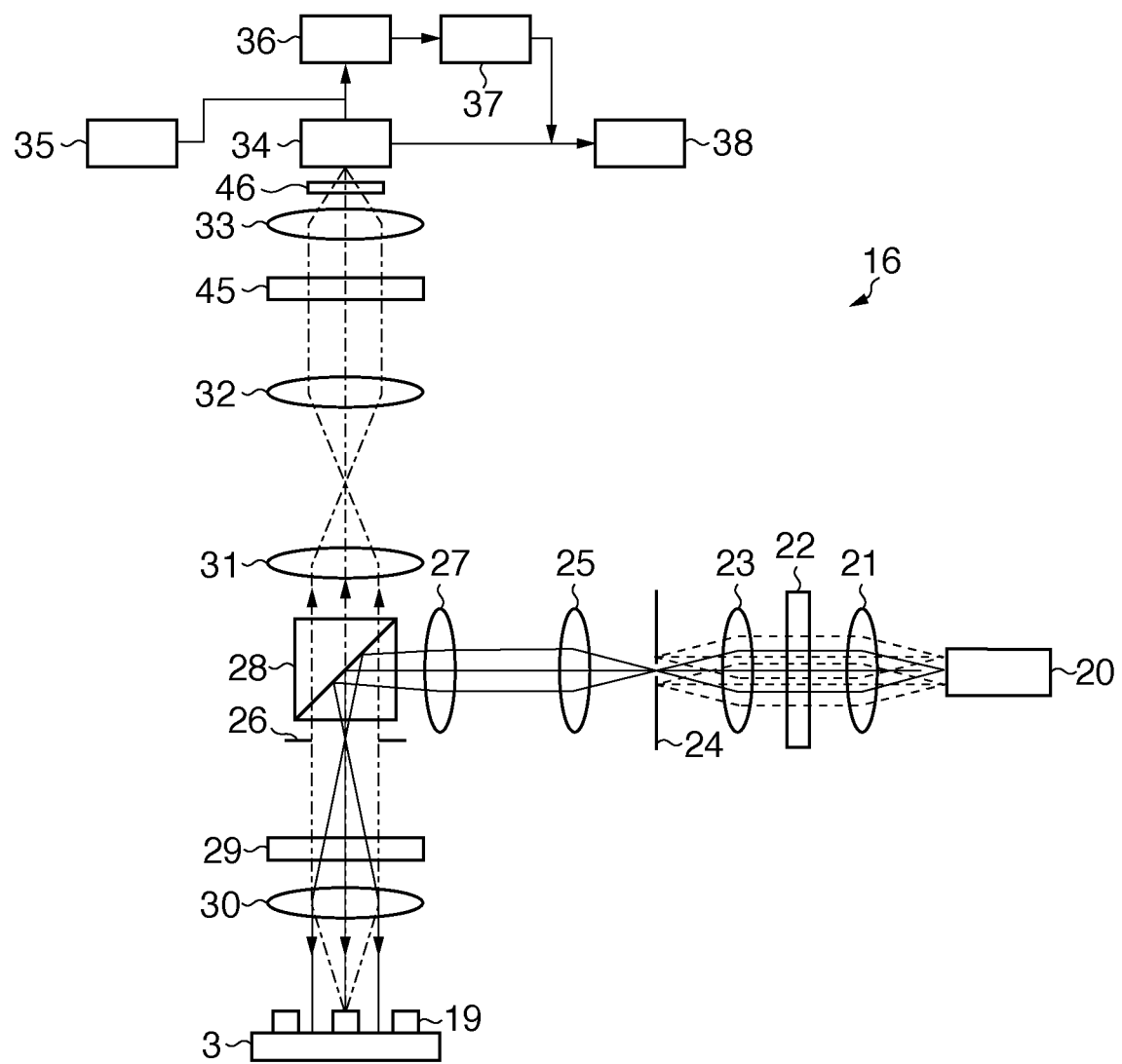
FIG. 3 is a view showing details of the arrangement of a wafer alignment detection system.
Figure 4:
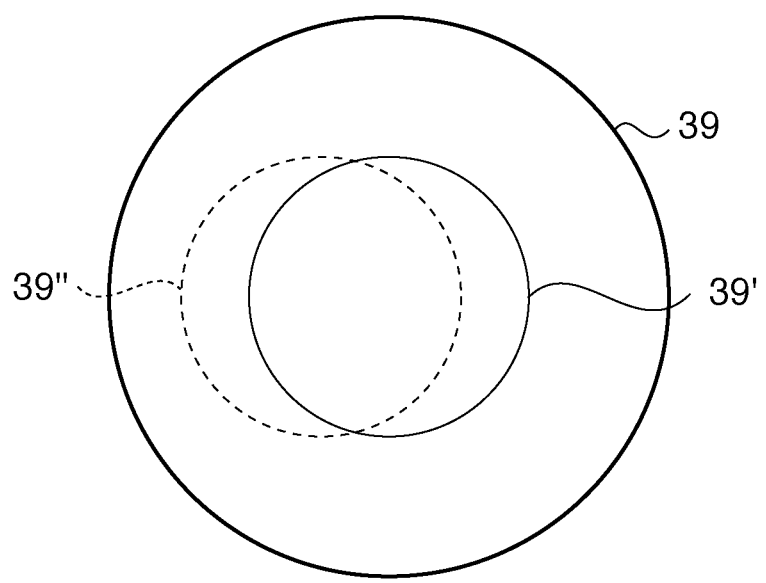
FIG. 4 is a view showing the beam sizes for a light source and pupil position.

FIG. 3 is a view showing details of the wafer alignment detection system 16 as an example of the position detector according to the present invention. Light guided from an illumination light source 20 (e.g., a fiber) for the wafer alignment detection system reaches an aperture stop 24 upon passing through a first relay optical system 21, wavelength filter plate 22, and second relay optical system 23. The aperture stop 24 matches the pupil plane (an optical Fourier transformation plane with respect to the object plane) of the wafer alignment detection system 16. The beam diameter for the aperture stop 24 is sufficiently smaller than that for the illumination light source 20 (e.g., a fiber) for the wafer alignment detection system. FIG. 4 shows the relationship of the beam diameters in this case. As compared to a beam diameter 39 for the light source 20, a beam diameter 39' for the aperture stop 24 is sufficiently small.

A plurality of types of filters having different transmitted wavelength ranges are inserted in the wavelength filter plate 22, and switched in response to a command from the controller 17. A plurality of types of stops having different illumination coherence factors σ are prepared for the aperture stop 24, and switched in response to a command from the controller 17 to be able to change the illumination coherence factor σ of the wafer alignment detection system 16. Although a plurality of types of filters and stops are provided to the wavelength filter plate 22 and aperture stop 24, they are of mechanisms which can be provided with new additional filters and stops.

The light which has reached the aperture stop 24 is guided to a polarizing beam splitter 28 upon passing through a first illumination optical system 25 and second illumination optical system 27. An S-polarized light component which is reflected by the polarizing beam splitter 28 in a direction perpendicular to the sheet surface of FIG. 3 is converted into circularly polarized light upon being transmitted through an NA stop 26 and λ/4 plate 29, and Kohler-illuminates the wafer alignment marks 19 formed on the wafer 3 upon passing through an objective lens 30 (the illumination light is indicated by the solid lines in FIG. 3). The NA of the NA stop 26 can be changed by changing its aperture value. The aperture value of the NA stop 26 can be changed in response to a command from the controller 17.

Reflected light, diffracted light, and scattered light (indicated by alternate long and short dashed lines in FIG. 3) generated by the wafer alignment marks 19 are converted into a P-polarized light component parallel to the sheet surface of FIG. 3 upon passing through the objective lens 30 and λ/4 plate 29, and the P-polarized light component is transmitted through the polarizing beam splitter 28. The transmitted light forms a detection signal of the wafer alignment mark 19 on a photoelectric conversion element 34 (e.g., a CCD camera) by a relay lens 31, first and second imaging optical systems 32 and 33, coma adjusting optical member 45, and wavelength shift difference adjusting optical member 46.

The photoelectric conversion element 34 constitutes an image pickup unit which picks up an image of an object to be detected. Various types of optical members from the illumination light source 20 to the wavelength shift difference adjusting optical member 46 constitute an optical system which forms an image of the object to be detected on the image pickup surface of the photoelectric conversion element 34 serving as the image pickup unit. Of the optical system, optical members from the illumination light source 20 to the second illumination optical system 27 constitute an illumination optical system.

The wafer alignment detection system 16 also includes a signal generation unit 35, noise obtaining unit 36, storage unit 37, and correction unit 38. The signal generation unit 35 generates a signal when a shift of the optical axis, the wavelength shift difference, the aberration, or the like of an optical member included in the above-described optical system is adjusted (to be described later). The noise obtaining unit 36 obtains a noise signal as the noise information of the wafer alignment detection system 16 in response to the signal generated by the signal generation unit 35. The storage unit 37 stores data on the noise signal obtained by the noise obtaining unit 36, in addition to data on a noise signal for each alignment condition. The correction unit 38 corrects the detection signal of the wafer alignment mark 19, which is detected by the photoelectric conversion element 34, using a noise signal under the alignment condition at the time (so-called noise correction). Hence, when a signal is generated upon adjusting an optical member, the correction unit 38 corrects the detection signal using a noise signal obtained in response to the generated signal. On the basis of the corrected detection signal, the wafer alignment detection system 16 detects the position of the wafer 3, and aligns it.

Normally, when the position of the wafer 3 is detected by observing the wafer alignment marks 19 on the wafer 3 by the wafer alignment detection system 16 as described above, monochromatic light generates interference fringes because of a transparent layer that is applied on the upper portion of the wafer alignment marks 19 or formed on it. For this reason, the alignment signal of the wafer alignment mark 19 detected contains the interference fringe signal, resulting in a failure in high-precision detection. Therefore, the illumination light source 20 of the wafer alignment detection system 16 as in this case is generally the one having a wide wavelength range to detect a signal containing a small amount of interference fringes.

To detect the wafer alignment marks 19 on the wafer 3 with high precision, images of the wafer alignment marks 19 must be detected clearly. In other words, the wafer alignment detection system 16 must focus on the wafer alignment marks 19. For this purpose, the wafer alignment detection system 16 is generally provided with an autofocus detection system (not shown). On the basis of the detection result obtained by the autofocus detection system, the wafer alignment marks 19 are driven onto a best focus plane of the wafer alignment detection system 16, thereby detecting the wafer alignment marks 19.

Note that although a description of the TTL-AA scheme will not be given herein, it is basically different from the OA detection system in that the upper portion of the wafer 3 is observed through the projection optical system 6.

Figure 5:
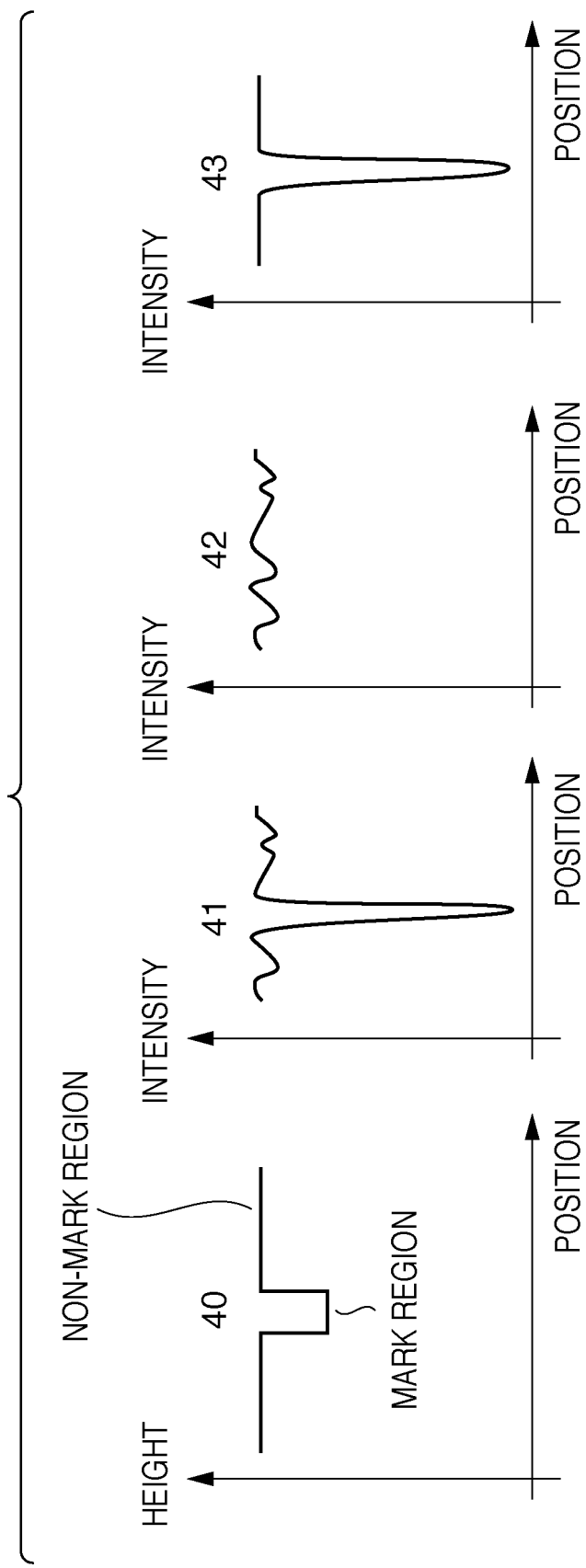
FIG. 5 illustrates graphs of a wafer alignment mark, detection signal, noise signal, and corrected detection signal.

FIG. 5 shows an example of the noise correction. Reference numeral 40 in FIG. 5 indicates the sectional structure of the alignment mark assuming that the abscissa indicates the position, and the ordinate indicates the height. Reference numeral 41 in FIG. 5 indicates a waveform assuming that the abscissa is the position, and the ordinate is the signal intensity upon detecting the alignment mark. The same applies to the following description. Normally, a detection signal of an alignment mark as indicated by reference numeral 40 in FIG. 5, which is detected by the wafer alignment detection system 16 under a certain alignment condition, has a variation in signal intensity in a region other than the mark, as indicated by reference numeral 41 in FIG. 5. This variation is attributed to the distortion of a detection signal, which is obtained by illuminating and observing the observation target surface, due to an illumination variation, a variation in sensitivity of, for example, the light-receiving element or image pickup element, or dust adhesion on the detection system. This variation translates into problematic measurement errors upon alignment.

In the conventional noise correction, an image of a region other than the mark is picked up, thereby obtaining a noise component of the wafer alignment detection system 16, as indicated by reference numeral 42 in FIG. 5. The detection signal 41 is then corrected based on the obtained noise signal, thereby aligning the wafer using a corrected detection signal as indicated by reference numeral 43 in FIG. 5. As compared to the detection signal 41 before the noise correction, the corrected detection signal 43 after the noise correction has no variation in the region other than the mark. This reduces measurement errors upon alignment, thus allowing high-precision alignment.

As shown in FIG. 6, a noise signal is normally prepared for each alignment condition set in the wafer alignment detection system 16 in advance (to be referred to as a "preset alignment condition" hereinafter). For a detection signal obtained under an alignment condition A, noise correction is performed using a noise signal A optimized for the alignment condition A. For a detection signal obtained under an alignment condition B, noise correction is performed using a noise signal B optimized for the alignment condition B. In other words, the wafer alignment detection system 16 prepares noise signals optimized for the preset alignment conditions.

In mounting the wafer alignment detection system 16 in the exposure apparatus, conditions with regard to the alignment performance (e.g., the amount of shift of the optical axis, the wavelength shift difference, and the coma) in the detection system 16 have been adjusted to some extent, but often change due to a temporal change in its properties. It is therefore necessary to periodically adjust the conditions. Also, depending on the mark to be observed, optimal optical axis correction is often performed for each wafer alignment mark, or the conditions are often adjusted after mounting the detection system 16 in the exposure apparatus. In other words, even when alignment conditions such as the illumination wavelength, illumination NA, and detection NA remain the same, the adjustment state of a condition with regard to the alignment performance such as a shift of the optical axis often changes. A change in noise component due to correction of a shift of the optical axis or the like alone has conventionally been thought to be small, but it becomes non-negligible in consideration of the recent increase in the precision of the exposure apparatus. As the adjustment state of a condition with regard to the alignment performance such as a shift of the optical axis changes, the slope of the detection signal, in turn, changes. Therefore, even when the alignment conditions remain the same, the use of a noise signal before the adjustment may make it impossible to perform optimal noise correction, resulting in measurement errors.

An alignment method when conditions with regard to the alignment performance are changed according to the present invention will be described with reference to the accompanying drawings by taking a case in which especially the amount of shift of the optical axis is changed as an embodiment.

Figure 7:
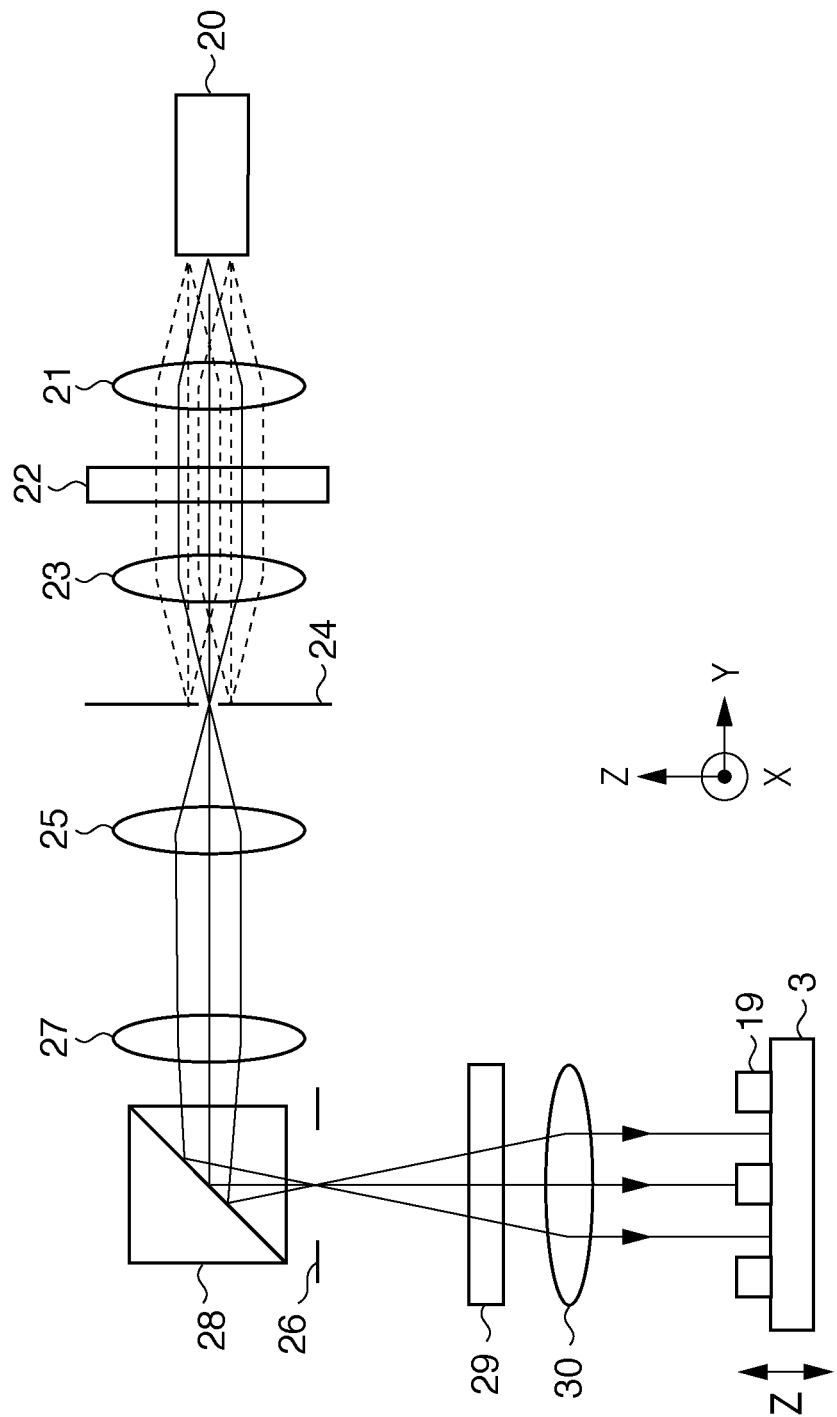
FIG. 7 is a view showing the illumination portion of the wafer alignment detection system when there is no shift of the optical axis.
Figure 8:
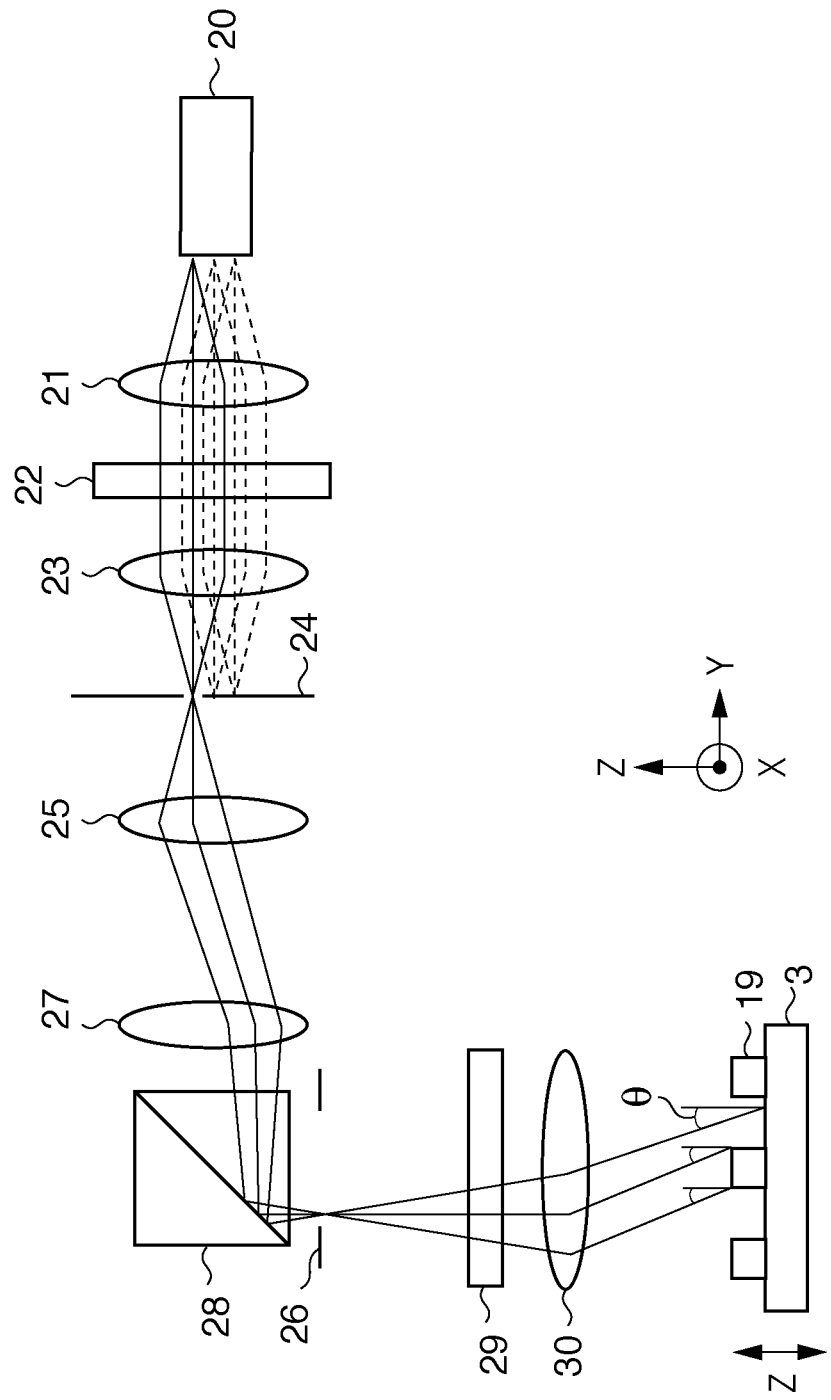
FIG. 8 is a view showing the illumination portion of the wafer alignment detection system when there is a shift of the optical axis.

First, a method of adjusting a shift of the optical axis of an optical system in the wafer alignment detection system 16 shown in FIG. 3 will be explained first. FIG. 7 shows the illumination optical system of the wafer alignment detection system 16 shown in FIG. 3. If there is no shift of the optical axis in the detection system 16 as shown in FIG. 7, the chief ray of the illumination light from the detection system 16 perpendicularly strikes the surface of the wafer 3. In contrast, if the aperture stop 24 in the detection system 16 is shifted as shown in FIG. 8, the primary ray of the illumination light from the detection system 16 strikes the surface of the wafer 3 not perpendicularly but with a certain angle θ.

At this time, the beam diameter for the aperture stop 24 lies at a position shifted from the central position of the beam diameter 39 for the illumination light source 20 (e.g., a fiber) for the wafer alignment detection system 16, as indicated by 39" in FIG. 4. This state will be referred to as that "the optical system has a shift of the optical axis". Although FIG. 8 exemplifies a shift of the optical axis attributed to a positional shift of the aperture stop 24, a shift of the optical axis is also generated when the position of the illumination light source 20 (e.g., a fiber) itself positioned at a position conjugate to the pupil in the illumination optical system shifts, as in the aperture stop 24. The shift of the optical axis in the optical system can be adjusted by moving the position of the aperture stop 24 or the illumination light source 20 for the wafer alignment detection system 16 shown in FIG. 8 in a direction in which they are drivable and which is perpendicular to the optical axis. In this manner, a shift of the optical axis in the wafer alignment detection system 16 of the OA scheme is adjusted by moving the aperture stop 24 or light source 20 in the detection system 16 in a direction perpendicular to the optical axis.

Figure 9:
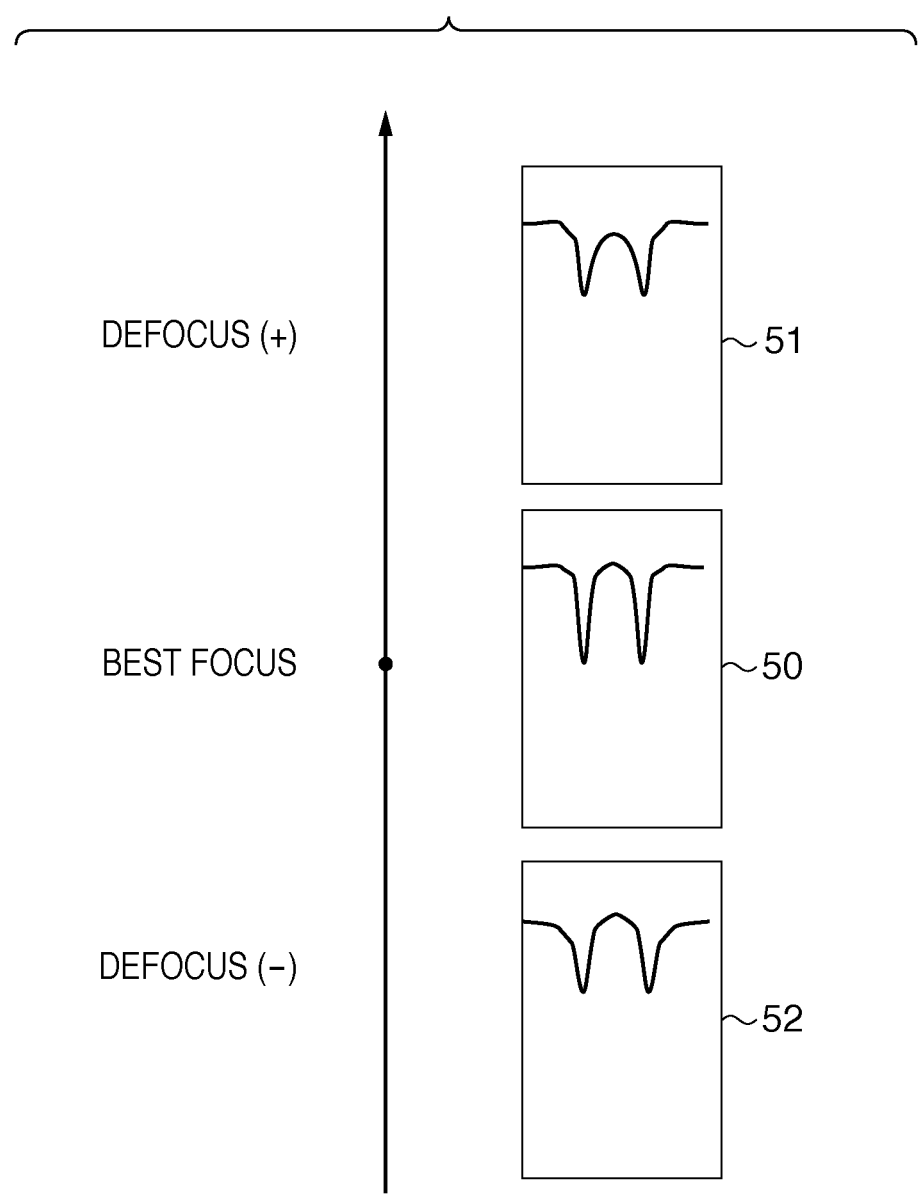
FIG. 9 is a graph obtained by defocusing a detection signal detected in an optical system having no shift of the optical axis.

A shift of the optical axis of an optical system in the wafer alignment detection system 16 is adjusted using the positional information of the alignment mark with respect to each defocus position (to be referred to as a defocus characteristic hereinafter). The defocus characteristic serving as an index of a shift of the optical axis of the optical system will be explained with reference to FIGS. 9 to 12. To check the defocus characteristic, an alignment mark of a chromium pattern need only be measured while being defocused. The alignment mark of a chromium pattern is formed on the stage reference plate 11 or the like in the apparatus, and data on the defocus characteristic can be easily obtained in the exposure apparatus. It is also possible to similarly obtain and correct the defocus characteristic of an alignment mark on the actual exposure wafer to be exposed actually. A difference in defocus characteristic between the chromium pattern formed on the stage reference plate 11 and the actual exposure wafer is known to occur due to, for example, the presence of an aberration component remaining in the detection system, or a difference in sectional structure between individual alignment marks. FIG. 9 shows a detection signal of an alignment mark of a chromium pattern. A detection signal 50 shown in FIG. 9 is a symmetrical detection signal detected in an ideal optical system having no shift of the optical axis of an optical system in the wafer alignment detection system 16. A detection signal 51 is obtained by defocusing the detection signal 50 in the plus direction, and a detection signal 52 is obtained by defocusing the detection signal 50 in the minus direction. As compared to the detection signal 50, the defocused detection signals 51 and 52 have low contrast but their symmetries are never disturbed because no shift of the optical axis remains in the optical system. In other words, the detection signals 51 and 52 have the same measurement center position as that of the detection signal 50. FIG. 10 shows the measurement center position with respect to the defocus at this time. The measurement center position of the detection signal takes a constant value irrespective of the defocus, as indicated by reference numeral 53. The slope of the measurement center position 53 of the detection signal with respect to the defocus is the defocus characteristic, which is zero in this case. If there exists no change in the measurement center position with respect to the defocus as shown in FIG. 10, a positional shift never takes place even when defocus occurs upon wafer alignment.

A detection signal 54 shown in FIG. 11 represents a case in which a shift of the optical axis remains in an optical system in the wafer alignment detection system 16. A detection signal 55 is obtained by defocusing the detection signal 54 in the plus direction, and a detection signal 56 is obtained by defocusing the detection signal 54 in the minus direction. The defocused detection signals 55 and 56 not only do not have lower contrasts than that of the detection signal 54 but also are asymmetrical due to the influence of the shift of the optical axis in the detection system 16. The detection signals 55 and 56 do not have the same measurement center position as that of the detection signal 54. FIG. 12 shows the measurement center position with respect to the defocus at this time. The measurement center position of the detection signal takes a value that depends on the defocus, as indicated by reference numeral 57. The slope of the measurement center position 57 with respect to the defocus is the defocus characteristic, which takes a certain value in this case. If there exists a change in the measurement center position with respect to the defocus as shown in FIG. 12, no positional shift occurs in a best focus state. However, defocus occurs more or less upon actual wafer alignment, which causes a positional shift. The defocus characteristic can be used as an index indicating a shift of the optical axis in the detection system 16. Hence, the shift of the optical axis in the detection system 16 need only be adjusted so that the defocus characteristic becomes zero.

Detailed examples of the noise correction are shown in FIGS. 13 to 17. Normally, a detection signal of an alignment mark as indicated by reference numeral 40 in FIG. 13, which is detected by the wafer alignment detection system 16 under a certain alignment condition, has a variation in signal intensity in the non-mark region, as indicated by reference numeral 60 in FIG. 13. This variation is attributed to the distortion of a detection signal, which is obtained by illuminating and observing the observation target surface, due to an illumination variation, a variation in sensitivity of, for example, the light-receiving element or image pickup element, or dust adhesion on the detection system. This variation translates into measurement errors upon alignment.

Figure 13:
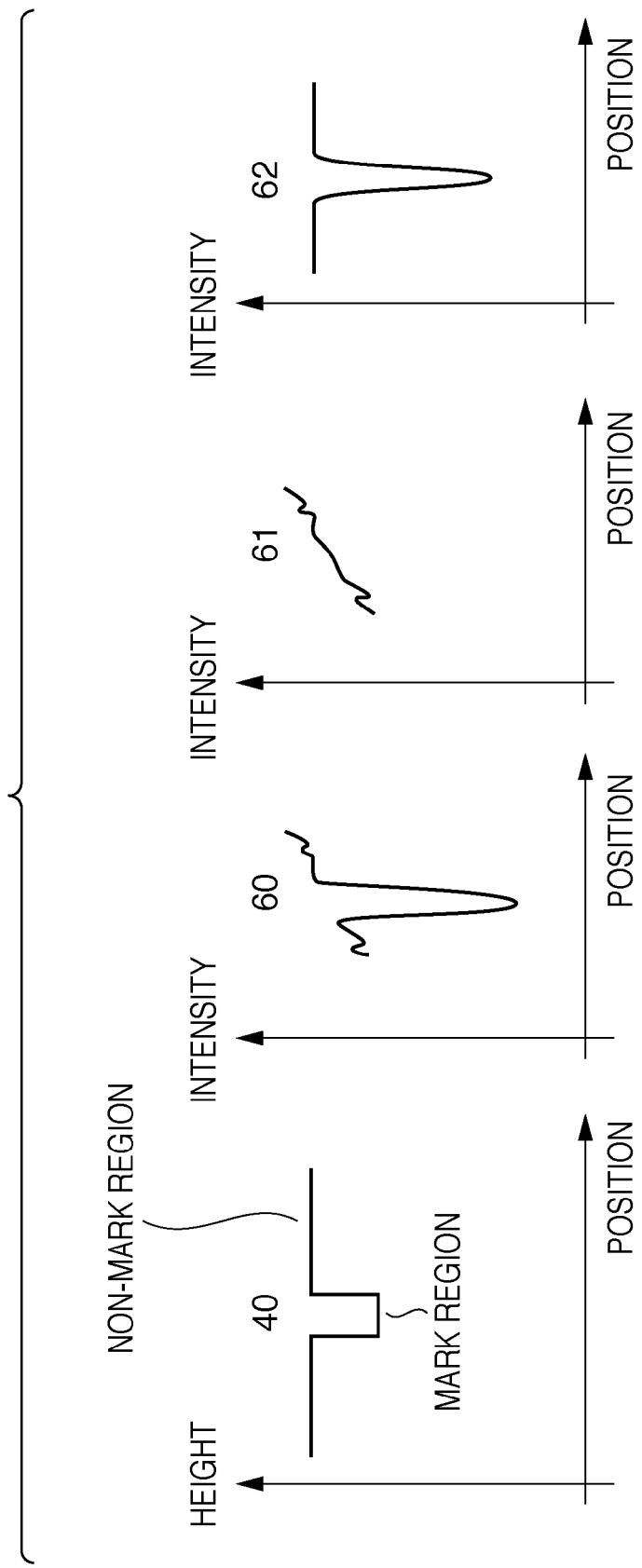
FIG. 13 illustrates graphs of a wafer alignment mark, detection signal, noise signal, and corrected detection signal.

In the conventional noise correction, an image of a region other than the mark is observed under the certain alignment condition, and a noise component of the wafer alignment detection system 16 as indicated by reference numeral 61 in FIG. 13 is stored in advance. The detection signal 60 is then corrected into a corrected detection signal as indicated by reference numeral 62 in FIG. 13, thereby aligning the wafer. As compared to the detection signal 60 before the noise correction, the corrected detection signal 62 after the noise correction has no variation in signal intensity in the non-mark region. This reduces measurement errors upon alignment, thus allowing high-precision alignment.

As shown in FIG. 14, a noise signal is normally prepared for each alignment condition set in the wafer alignment detection system 16 in advance. For a detection signal obtained under an alignment condition C, noise correction is performed using a noise signal C optimized for the alignment condition C.

However, a shift of the optical axis in the wafer alignment detection system is often adjusted in the exposure apparatus. In this case, even when alignment conditions such as the illumination wavelength, illumination NA, and detection NA remain the same, high-precision alignment often cannot be done using a noise signal before the adjustment of a shift of the optical axis.

Figure 15:
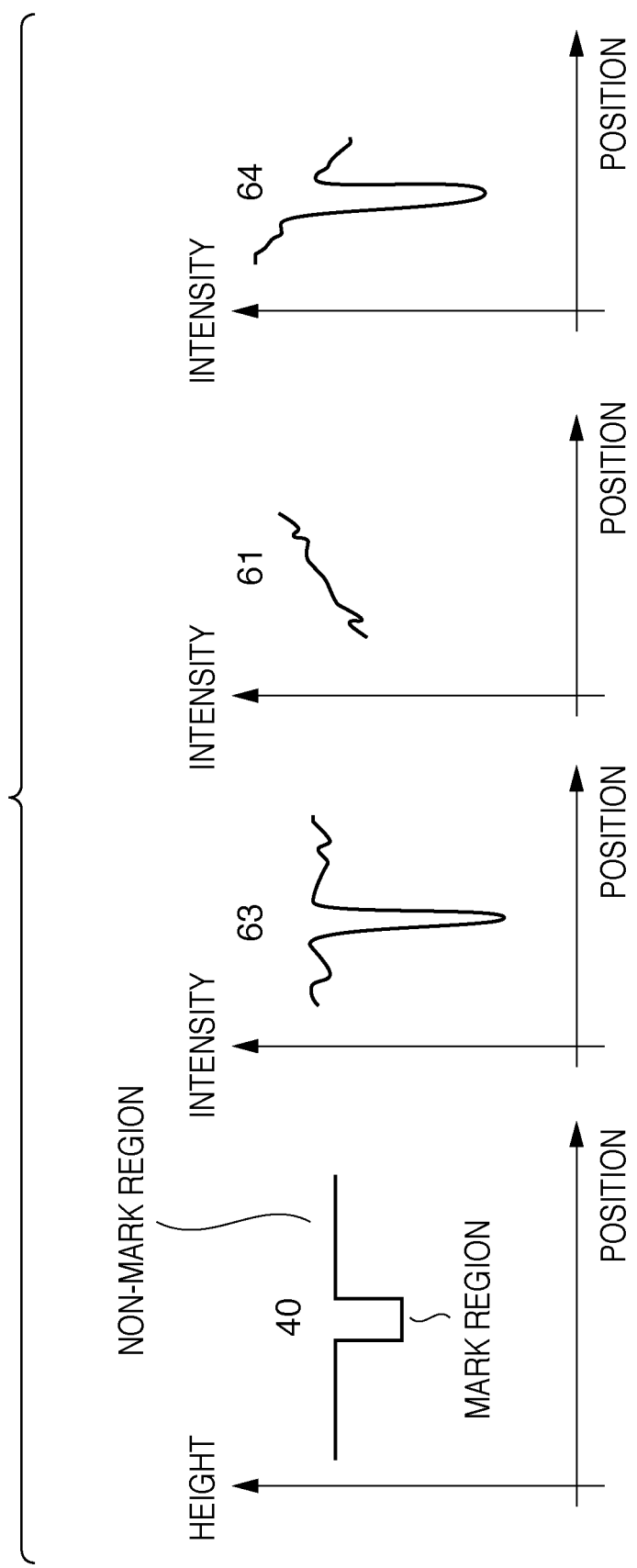
FIG. 15 illustrates graphs of a wafer alignment mark, detection signal, noise signal, and corrected detection signal.

A detection signal 63 shown in FIG. 15 is measured under the same alignment condition C as that for the detection signal 60 shown in FIG. 13, but is obtained in a different adjustment state of a shift of the optical axis in the wafer alignment detection system. Because the detection signal 63 shown in FIG. 15 is obtained in a different adjustment state of a shift of the optical axis in the detection system from that for the detection signal 60 shown in FIG. 13, the detection signal differs despite the same alignment condition. When noise correction is performed for the detection signal 63 shown in FIG. 15 using a noise signal 61 before the adjustment of a shift of the optical axis in the detection system, an asymmetrical detection signal having a slope in a region other than the mark is obtained, as indicated by reference numeral 64. Such an asymmetrical detection signal leads to measurement errors upon alignment. In this manner, when the adjustment state of a shift of the optical axis in the detection system is changed even when the alignment conditions remain the same, a noise signal must be newly generated in the adjustment state of a shift of the optical axis after the change.

Figure 17:
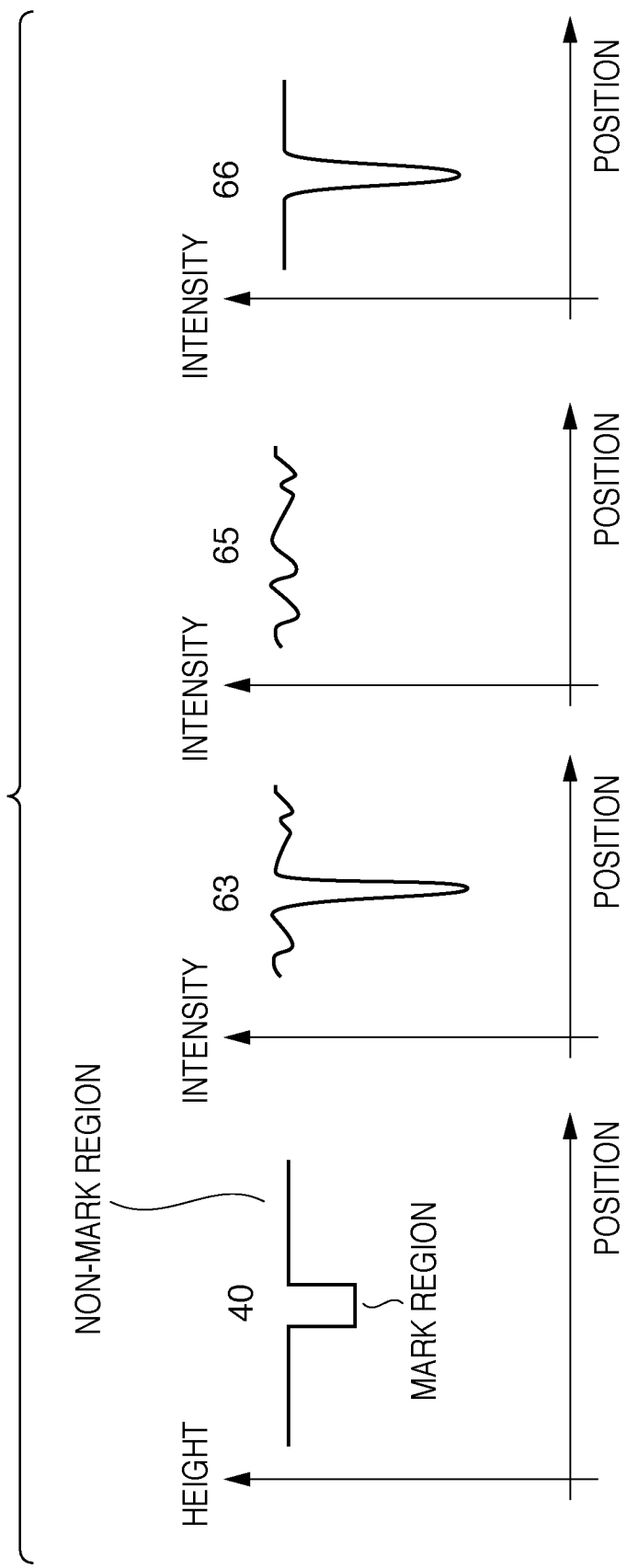
FIG. 17 illustrates graphs of a wafer alignment mark, detection signal, noise signal, and corrected detection signal.

In this embodiment, a noise signal CC is newly generated in accordance with the result of change of the adjustment state of a shift of the optical axis for the alignment condition C (FIG. 16). The newly generated noise signal CC is optimized for the detection signal obtained by changing the adjustment state of a shift of the optical axis for the alignment condition C, which allows appropriate noise correction. As in the detection signal 63 shown in FIG. 15, because a detection signal 63 shown in FIG. 17 is obtained in a different adjustment state of a shift of the optical axis in the detection system from that for the detection signal 60 shown in FIG. 13, the detection signal differs despite the same alignment condition. Noise correction is performed for the detection signal 63 using a noise signal 65 newly generated in the changed adjustment state of a shift of the optical axis. With this operation, a symmetrical corrected detection signal 66 free from any variation or slope in the non-mark region is obtained. As compared to the corrected detection signal 64 obtained by noise correction using the noise signal 61 obtained before the adjustment of a shift of the optical axis in the detection system, the corrected detection signal 66 obtained by noise correction using the noise signal 65 obtained in accordance with the result of adjustment of a shift of the optical axis in the detection system is free from any variation or slope in a region other than the mark. This allows high-precision alignment.

In other words, even when the state of a shift of the optical axis in the wafer alignment detection system 16 is changed under the same alignment condition, obtaining an optimal noise signal in the changed state of a shift of the optical axis makes it possible to obtain a corrected detection signal free from any variation or slope.

Although a case in which a noise signal is newly generated in accordance with the result of change of the state of a shift of the optical axis in the wafer alignment detection system 16 under the same alignment condition has been exemplified above, the present invention is not particularly limited to a case in which a noise signal is newly generated in accordance with the result of change of only the state of a shift of the optical axis. A noise signal is newly generated in accordance with the result of change of the coma amount by the optical member 45 which can adjust the coma in the detection system 16, in addition to the adjustment of a shift of the optical axis. The coma in the wafer alignment detection system 16 is adjusted by moving the optical member 45, which can adjust the coma, in a direction perpendicular to the optical axis direction. Also, a noise signal is newly generated in accordance with the result of change of the wavelength shift difference by the optical member 46 to adjust a wavelength-dependent shift generated due to decentration of an optical member included in the optical system. The wavelength shift difference adjusting optical member 46 has a plurality of wedge-shaped optical members, which are positioned such that the adjacent wedge-shaped surfaces of different wedge-shaped optical members are parallel to each other and tilted at a predetermined angle with respect to a direction perpendicular to the detection light optical axis. The wavelength shift difference adjusting optical member 46 can adjust the wavelength shift difference by adjusting the interval between the wedge-shaped optical members.

According to this embodiment, it is possible to perform optimal noise correction irrespective of the way the detection system 16 is adjusted. This makes it possible to always perform high-precision alignment while reducing measurement errors.

The sequence of obtaining a noise signal when a condition with regard to the alignment performance such as the amount of shift of the optical axis, the coma amount, or the wavelength shift difference in the wafer alignment detection system 16 is changed may be the one which can automatically obtain a noise signal as the condition is changed.

[Embodiment of Manufacture of Device]

Devices (e.g., a semiconductor integrated circuit device and liquid crystal display device) are manufactured by an exposure step of exposing a substrate using the exposure apparatus according to the above-described embodiment, a development step of developing the substrate exposed in the exposure step, and other known steps (e.g., etching, resist removal, dicing, bonding, and packaging steps) of processing the substrate developed in the development step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-286686, filed Nov. 2, 2007, which is hereby incorporated by reference herein in its entirety.

What is claimed is:

1. A position detector which detects a position of a mark on an object to be detected, the detector comprising:
   an image pickup unit configured to pick up an image of the object to be detected;
   an optical system configured to form an image of the object to be detected on an image pickup surface of said image pickup unit;
   a noise obtaining unit configured to obtain noise information of an electrical signal in an image of a region other than the mark using said optical system and said image pickup unit; and
   a unit configured to decrease, using the noise information obtained by said noise obtaining unit, noise of the image of the mark obtained using said optical system and said image pickup unit,
   wherein said noise obtaining unit obtains the noise information after adjustment of said optical system by moving an optical member included in said optical system.

2. The detector according to claim 1, further comprising
   a signal generation unit configured to generate a signal in accordance with the adjustment of said optical system by moving the optical member included in said optical system,
   wherein said noise obtaining unit obtains noise information by picking up the image of the region other than the mark using said optical system and said image pickup unit in response to the signal.

3. The detector according to claim 1, further comprising
   a storage unit configured to store the noise information obtained by said noise obtaining unit,
   wherein the noise of the image of the mark is decreased using the noise information stored in said storage unit.

4. The detector according to claim 1, wherein said optical system includes an illumination optical system, and said optical member is at least one of a light source, a fiber and an aperture stop of said illumination optical system, and can be driven in a direction perpendicular to an optical axis of said illumination optical system.

5. The detector according to claim 1, wherein said optical member is configured to adjust an aberration generated in said optical system.

6. The detector according to claim 1, wherein said optical member is configured to correct an image shift which depends on a wavelength generated due to decentration of a second optical member included in said optical system.

7. A position detection method of forming an image of a mark on an object to be detected, and picking up the formed image of the mark by an image pickup unit, thereby detecting a position of the mark, the method comprising:
   an adjusting step of adjusting an optical system configured to form an image of the object to be detected on an image pickup surface of said image pickup unit by moving an optical member included in the optical system;
   a noise obtaining step of obtaining noise information of an electrical signal in an image of a region other than the mark using the optical system and the image pickup unit after said adjusting step; and
   a decreasing step of decreasing, using the noise information obtained in the noise obtaining step, noise of the image of the mark obtained using the optical system and the image pickup unit.

8. The method according to claim 7, further comprising a signal generation step of generating a signal in accordance with the result of the adjustment of the optical member included in the optical system,
   wherein in the noise obtaining step, noise information is obtained by picking up an image of a region other than the mark using the optical system and the image pickup unit in response to the signal.

9. The method according to claim 7, further comprising a storing step of storing the noise information obtained in the noise obtaining step,
   wherein in the decreasing step, the noise of the image of the mark is decreased using the noise information stored in the storing step.

10. An exposure apparatus which exposes a substrate to an image of a pattern formed on an original, the apparatus comprising
    a position detector configured to detect a position of a mark on the substrate as an object to be detected,
    wherein the substrate is aligned based on the position detection result obtained by said position detector, and
    wherein the position detector comprises:
    an image pickup unit configured to pick up an image of the object to be detected;
    an optical system configured to form an image of the object to be detected on an image pickup surface of the image pickup unit;
    a noise obtaining unit configured to obtain noise information of an electrical signal in an image of a region other than the mark using the optical system and the image pickup unit; and
    a unit configured to decrease, using the noise information obtained by the noise obtaining unit, noise of the image of the mark obtained using the optical system and the image pickup unit,
    wherein the noise obtaining unit obtains the noise information after adjustment of the optical system by moving an optical member included in the optical system.

11. A method of manufacturing a device, the method comprising:
    exposing a substrate using an exposure apparatus;
    developing the exposed substrate; and
    processing the developed substrate to manufacture the device,
    wherein the exposure apparatus comprises a position detector configured to detect a position of a mark on the substrate as an object to be detected,
    wherein the substrate is aligned based on the position detection result obtained by the position detector, and
    wherein the position detector comprises:
    an image pickup unit configured to pick up an image of the object to be detected;
    an optical system configured to form an image of the object to be detected on an image pickup surface of the image pickup unit;
    a noise obtaining unit configured to obtain noise information of an electrical signal an image of a region other than the mark using the optical system and the image pickup unit; and
    a unit configured to decrease, using the noise information obtained by the noise obtaining unit, noise of the image of the mark obtained using the optical system and the image pickup unit, wherein said noise obtaining unit obtains the noise information after adjustment of said optical system by moving an optical member included in said optical system.

12. A position detection method of forming an image of a mark on an object to be detected, and picking up the formed image of the mark by an image pickup unit, thereby detecting a position of the mark, the method comprising:
- an adjusting step of adjusting at least one of a shift of an optical axis, an aberration and an image shift which depends on wavelengths of an optical system configured to form an image of the object to be detected on an image pickup surface of the image pickup unit;
- a noise obtaining step of obtaining noise information of an electrical signal in an image of a region other than the mark using the optical system and the image pickup unit after said adjusting step; and
- a decreasing step of decreasing, using the noise information obtained in the noise obtaining step, noise of the image of the mark obtained using the optical system and the image pickup unit.

* * * * *